(12) United States Patent
Matsubara et al.

(10) Patent No.: US 9,268,322 B2
(45) Date of Patent: Feb. 23, 2016

(54) METHOD AND APPARATUS FOR CREATING NUMERICAL CONTROL MACHINING PROGRAM AND PROGRAM FOR CAUSING COMPUTER TO IMPLEMENT SAME METHOD

(75) Inventors: Susumu Matsubara, Chiyoda-Ku (JP);
Kenji Iriguchi, Chiyoda-ku (JP);
Nobuyuki Takahashi, Chiyoda-ku (JP);
Mahito Matsuura, Nagoya (JP);
Takeshi Tasaka, Fukuyama (JP);
Takashi Kambara, Fukuyama (JP)

(73) Assignee: Mitsubishi Electric Corporation, Tokyo (JP)

( * ) Notice: Subject to any disclaimer, the term of this patent is extended or adjusted under 35 U.S.C. 154(b) by 512 days.

(21) Appl. No.: 13/882,789

(22) PCT Filed: Nov. 4, 2010

(86) PCT No.: PCT/JP2010/006491
§ 371 (c)(1),
(2), (4) Date: Jun. 7, 2013

(87) PCT Pub. No.: WO2012/059956
PCT Pub. Date: May 10, 2012

(65) Prior Publication Data
US 2013/0253693 A1    Sep. 26, 2013

(51) Int. Cl.
*G05B 19/18*        (2006.01)
*G05B 19/4093*      (2006.01)
*G06F 17/50*        (2006.01)

(52) U.S. Cl.
CPC .......... *G05B 19/182* (2013.01); *G05B 19/4093* (2013.01); *G05B 2219/35098* (2013.01); *G05B 2219/36196* (2013.01); *G05B 2219/36321* (2013.01); *G06F 17/50* (2013.01)

(58) Field of Classification Search
None
See application file for complete search history.

(56) References Cited

U.S. PATENT DOCUMENTS

| 4,713,747 | A | 12/1987 | Niwa |
| 5,731,982 | A | 3/1998 | Namba et al. |
| 5,757,649 | A | 5/1998 | Kato |
| 6,862,493 | B2 | 3/2005 | Matsubara et al. |
| 7,487,006 | B2 | 2/2009 | Kamiya et al. |
| 7,620,473 | B2 | 11/2009 | Kamiya et al. |
| 2006/0058908 | A1* | 3/2006 | Kamiya ............. G05B 19/4093 700/186 |

FOREIGN PATENT DOCUMENTS

| JP | 59-049608 A | 3/1984 |
| JP | 60-180748 A | 9/1985 |

(Continued)

*Primary Examiner* — Darrin Dunn
*Assistant Examiner* — Geoffrey Wellman
(74) *Attorney, Agent, or Firm* — Sughrue Mion, PLLC; Richard C. Turner

(57) ABSTRACT

An apparatus that creates, based on shape data of an object to be machined and grinding allowance data for the shape data, a numerically controlled machining program that has the grinding allowance data reflected in the shape data, is configured to include storing means 2 and 4 that store the shape data of the object to be machined and the grinding allowance data; a shape data modification means 5 that modifies the shape data to create, based on the grinding allowance data, shape data having a grinding allowance; and a numerically controlled machining program creation means 6 that creates a numerically controlled machining program for the modified shape data, with the apparatus enabling easy and efficient creation of a numerically controlled machining program having the grinding allowance reflected in the shape data.

20 Claims, 13 Drawing Sheets

Related art

Uncut portion due to cutting edge radius remains at this place (unground portion) and yet this remaining uncut potion is not eliminated during grinding Present embodiment Establishing amount of adjustment eliminates, even if uncut portion due to cutting edge radius remains, remaining uncut potion during grinding

(56) References Cited

FOREIGN PATENT DOCUMENTS

| | | |
|---|---|---|
| JP | 62-140746 A | 6/1987 |
| JP | 03-179510 A | 8/1991 |
| JP | 06-210549 A | 8/1994 |
| JP | 07-319529 A | 12/1995 |
| JP | 09-016657 A | 1/1997 |
| JP | 2004-272837 A | 9/2004 |

* cited by examiner

| No. | Graphical element | Grinding allowance | Amount of adjustment | Type of pecking | Pecking width | Pecking depth |
|---|---|---|---|---|---|---|
| D1 | 001 | 0.3 | 0.5 | – | – | – |
| D2 | 002 | 0.3 | 0.0 | Horizontal pecking | 0.2 | 0.3 |

FIG. 3
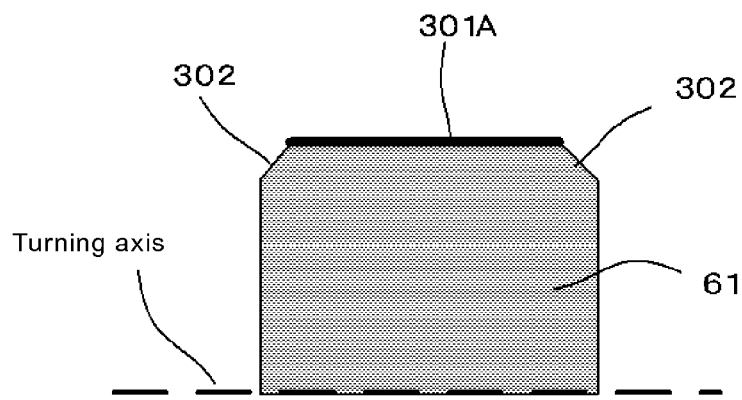
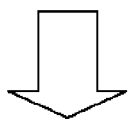
| No. | Graphical element | Grinding allowance | Amount of adjustment | Type of pecking | Pecking width | Pecking depth |
|-----|-------------------|--------------------|-----------------------|------------------|----------------|----------------|
| D11 | Edge line 301A | 0.3 | 0.0 | – | – | – |
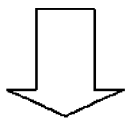
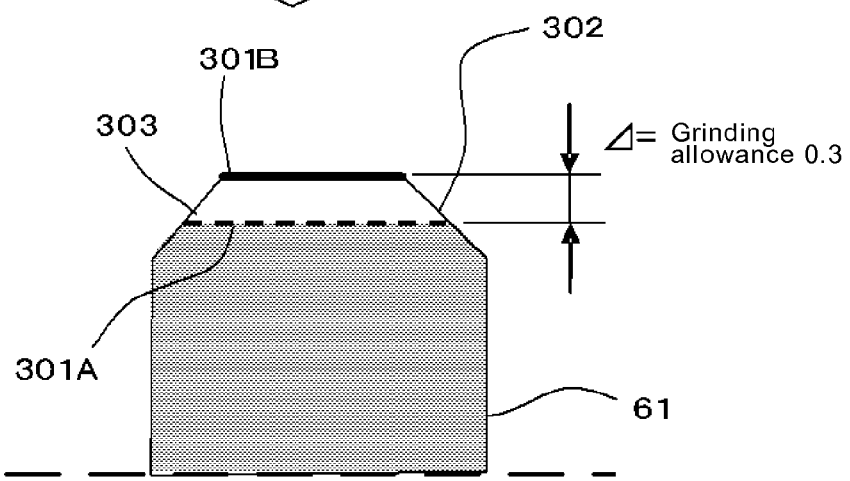

FIG. 6
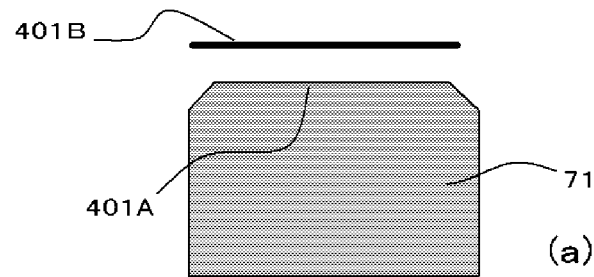
(a)
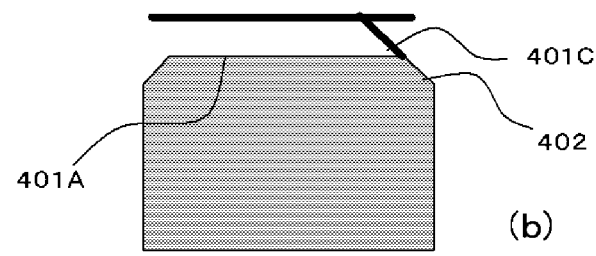
(b)
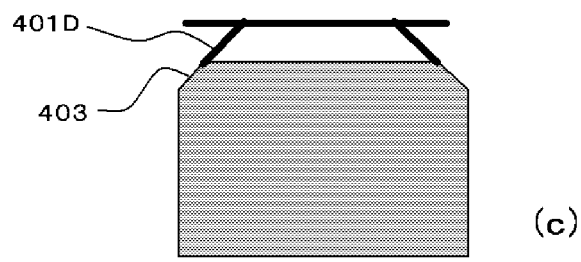
(c)
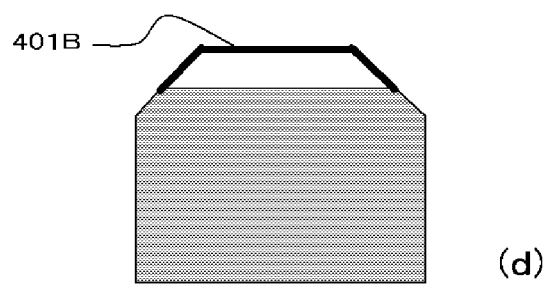
(d)
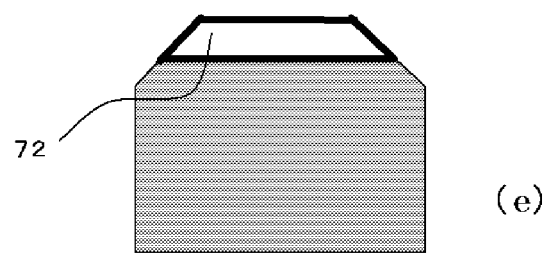
(e)

FIG. 8
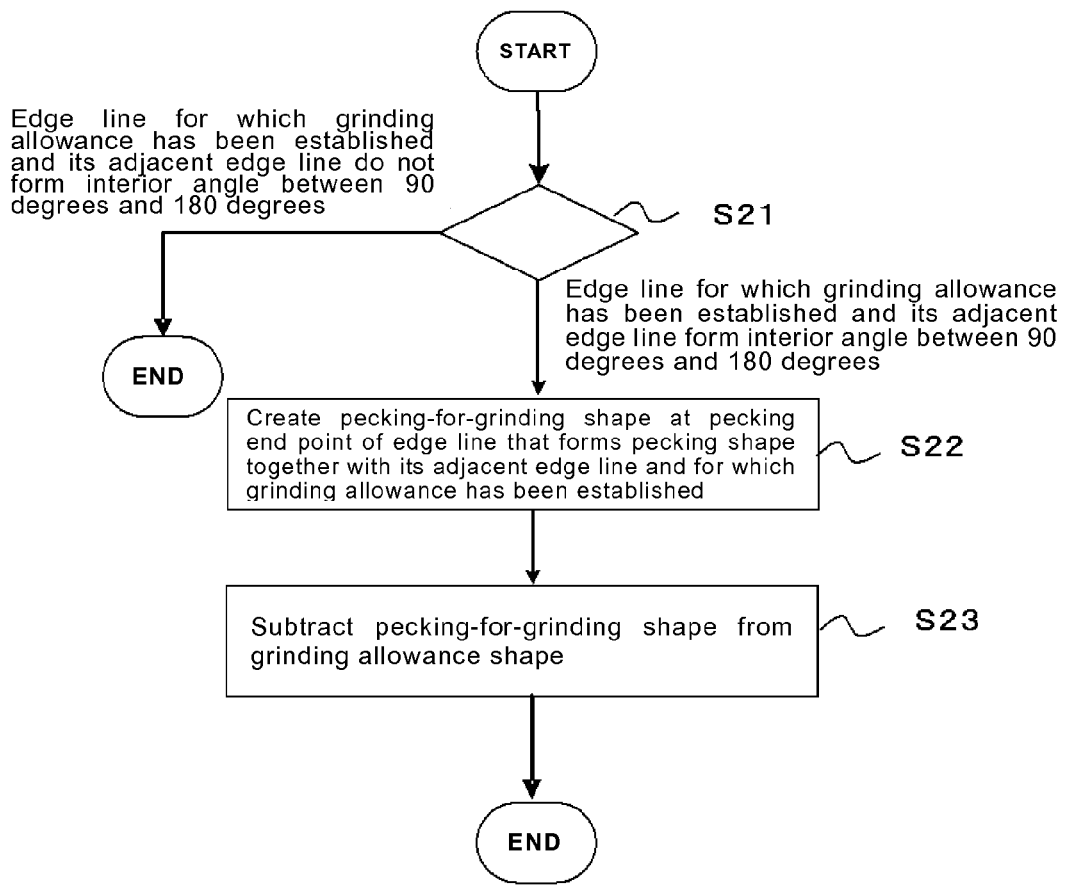
FIG. 9
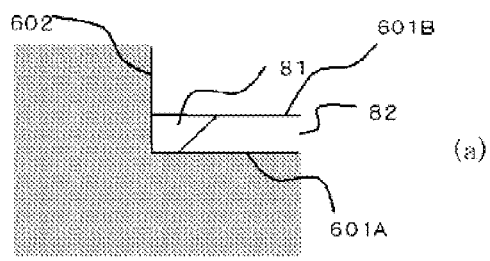
(a)
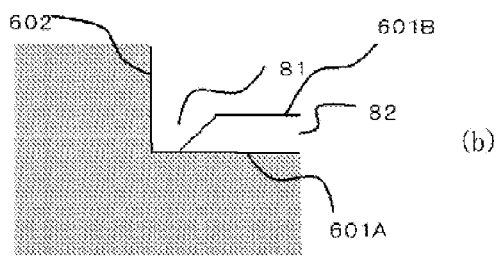
(b)

FIG. 10
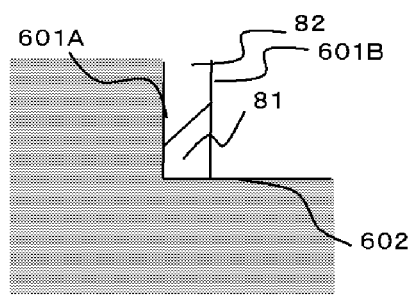
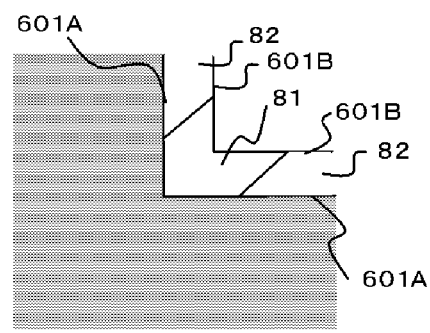

FIG. 11
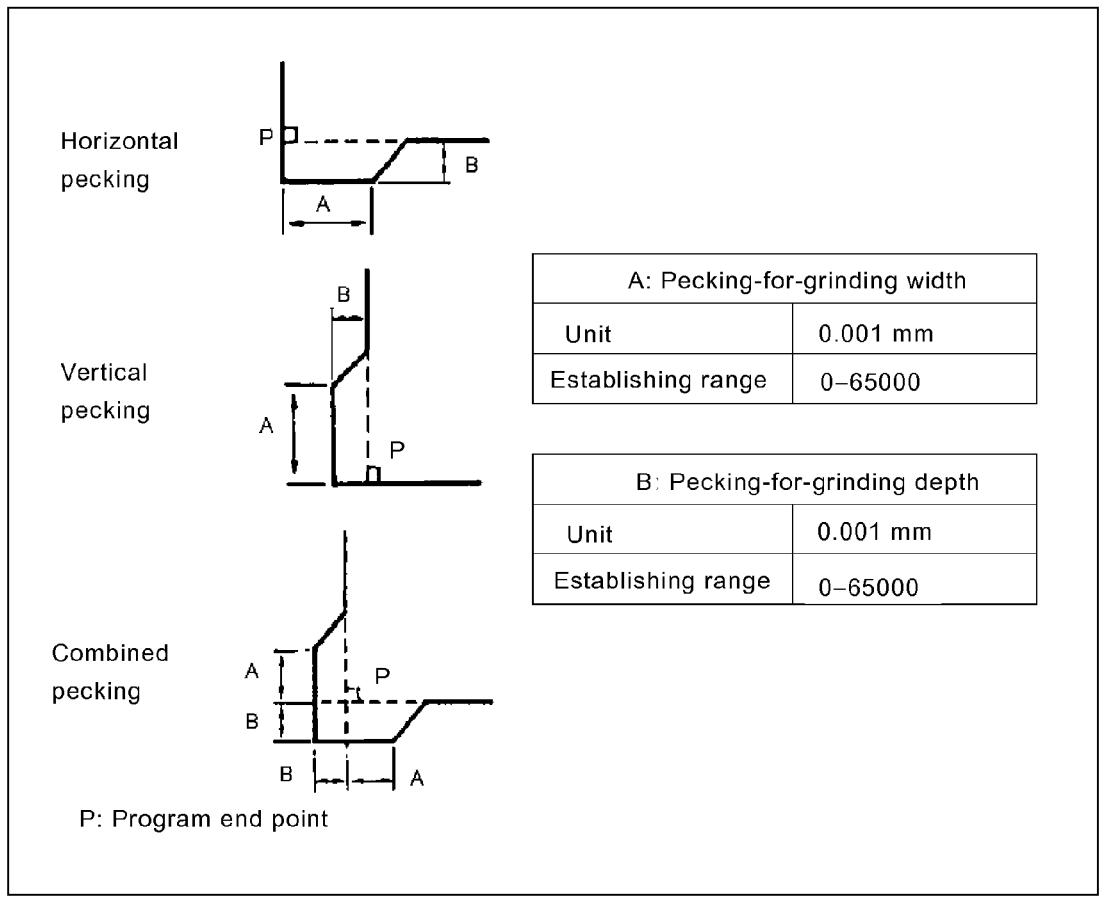
P: Program end point
FIG. 12
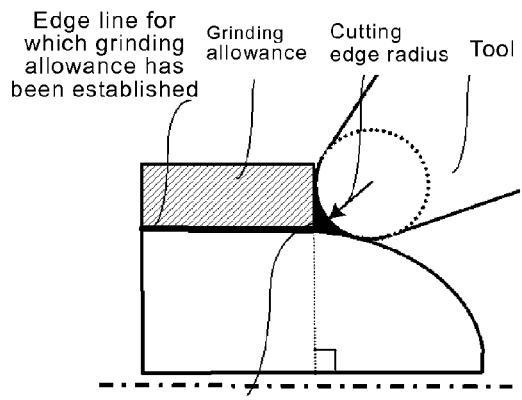
Uncut portion due to cutting edge radius remains at this place (unground portion) and yet this remaining uncut potion is not eliminated during grinding
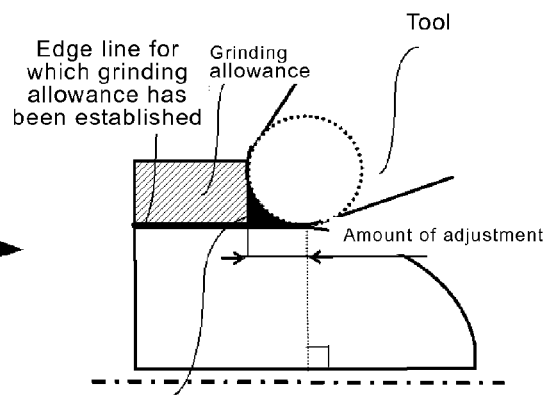
Establishing amount of adjustment eliminates, even if uncut portion due to cutting edge radius remains, remaining uncut potion during grinding FIG. 14
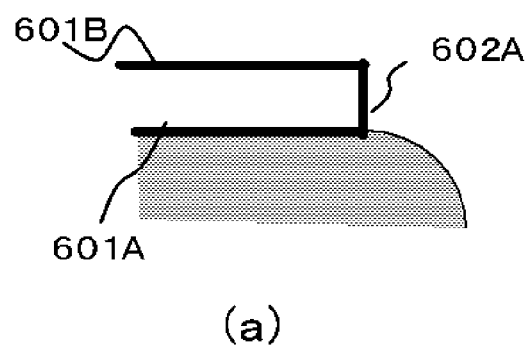
(a)
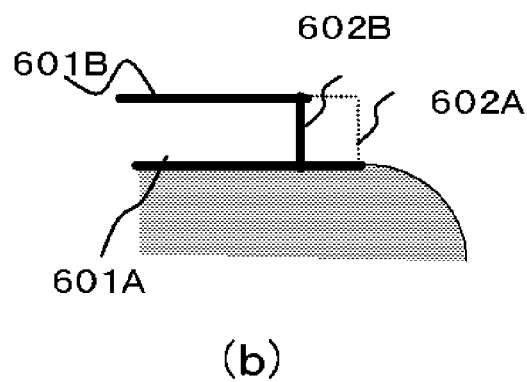
(b)

| No. | Graphical element | Grinding allowance | Amount of adjustment | Type of pecking | Pecking width | Pecking depth |
|---|---|---|---|---|---|---|
| D1 | 001 | 0.3 | 0.5 | – | – | – |
| D2 | 002 | 0.3 | 0.0 | – | 0.2 | 0.3 |

METHOD AND APPARATUS FOR CREATING NUMERICAL CONTROL MACHINING PROGRAM AND PROGRAM FOR CAUSING COMPUTER TO IMPLEMENT SAME METHOD

CROSS REFERENCE TO RELATED APPLICATIONS

This application is a National Stage of International Application No. PCT/JP2010/006491 filed Nov. 4, 2010, the contents of all of which are incorporated herein by reference in their entirety.

TECHNICAL FIELD

The present invention relates to methods and apparatuses for creating numerical control (hereinafter abbreviated as NC) machining programs that create NC machining programs for providing NC to machine tools, and to programs for causing a computer to implement the creation methods, and in particular, to creation of an NC machining program into which to incorporate a grinding allowance.

BACKGROUND ART

Assistance features for creating programs in apparatuses for creating NC machining programs have been enhanced in recent years, and NC machining programs have been able to be easily created by an operator's establishing coordinate values of an object to be machined, while viewing a production drawing. Further, an apparatus for creating an NC machining program has also appeared in the market such that an NC machining program can be created by directly loading into the apparatus, CAD data modeled by a designer using a CAD system.

However, a method has been used such that when the operator, while viewing the production drawing, performs direct programming of (modification of) the NC machining program, the operator calculates machining target dimensions by manual calculation or using a calculator and also enters in the NC machining program, coordinate values corrected based on the calculation results. A problem with this method has been that complicated modification of the NC machining program is likely to cause errors in calculation and/or data entry, resulting in the created NC machining program lacking reliability.

For this reason, a method has been proposed (refer to Patent Document 1) such that when a molded structure is machined into a final structure, machining margin (finish margin) data is entered on a screen for a machining surface needing a surface finish, to create data of a structure to which the machining margin has been provided; next, a tool path of a tool head with respect to the structure with the machining margin is created for interference checking on the screen; and in states where interference occurs, the operator changes the tool to a longer one, and rechecks the interference, whereby tool path data for machining the machining margin is created.

Further, an apparatus has been proposed as another example of the related art (refer to Patent Document 2) in which an attribute list is prepared where attributes, their corresponding machining margin amounts and the like are established in advance; the apparatus includes a final workpiece CAD that creates final workpiece shape data having attributes imparted to surfaces of a final workpiece, an interim workpiece CAD that creates, based on the final workpiece shape data and the attribute list, interim workpiece shape data in which machining margins that have the machining margin amounts corresponding to attributes of surfaces of a final workpiece shape have been provided to each of the surfaces, and an interim workpiece machining CAM that automatically calculates, based on the final workpiece shape data and the attribute list, a tool path for cutting the machining margins shape from the interim workpiece shape.

RELATED ART DOCUMENT

Patent Document

[Patent Document 1]
Japanese Unexamined Patent Application Publication No. H09-16657
[Patent Document 2]
Japanese Unexamined Patent Application Publication No. 2004-272837

DISCLOSURE OF INVENTION

Problem that the Invention is to Solve

The above related arts, however, relate to a technique for providing machining margins to final structures, and to calculation of a tool path for cutting an article produced by casting, in which technique there is no concept of a grinding allowance, nor does machining be performed so that a grinding allowance is left uncut, but the machining margin is removed by cutting.

Further, in terms of machining of portions associated with product capability and performance, an NC machining program needs to be created taking into consideration a remaining uncut portion due to a tool cutting edge radius so that defective machining is prevented from occurring; however, a problem with the above related arts has been that the uncut portion remains in some cases.

In addition, when an apparatus for creating NC machining programs has capability that loads CAD data to create an NC machining program, a method is used such that a shape of an object to be machined is modeled using machining target dimensions for which allowance has been made in advance for a grinding allowance. A problem with this method has been that a designer and a CAD data operator are caused to forcefully calculate the machining target dimensions and enter them in the NC machining program, resulting in a time and effort consuming job.

The present invention is directed to overcome such problems, and an object of the invention is to provide a method and an apparatus for creating NC machining programs, that can easily create an NC machining program having a grinding allowance reflected in shape data, and a program for causing a computer to implement the creation method.

Another object of the invention is to provide a method and an apparatus for creating NC machining programs—that can easily create an NC machining program having a grinding allowance reflected in shape data, and moreover, can provide an NC machining program that does not cause any uncut portion to remain even when the NC machining program having the grinding allowance reflected in the shape data is created—and a program for causing a computer to implement the creation method.

Means for Solving the Problem

In order to overcome the above problems and to achieve objects, a method of creating an NC machining program according to the present invention includes a step of storing shape data of an object to be machined and grinding allowance data; a shape data modification step of modifying, based on the grinding allowance data, the shape data, to create shape data inclusive of a grinding allowance; and a step of creating an NC machining program for the modified shape data, wherein the shape data modification step includes a step of determining, when the shape data modification means creates a shape data having a grinding allowance by modifying the shape data of the object to be machined, whether or not an uncut portion due to a tool cutting edge radius remains on an edge line segment adjacent to an edge line for which a grinding allowance is established, and a step of creating, in situations where the uncut portion due to the tool cutting edge radius remains on the edge line segment adjacent to the edge line for which the grinding allowance is established, shape data having a grinding allowance in which an amount of adjustment for eliminating during grinding the remaining uncut portion has been taken into consideration.

Further, the method of creating the NC machining program according to the present invention is such that the shape data modification step includes a step of creating, when the shape data of the object to be machined is modified to create shape data having a grinding allowance, the shape data by taking into consideration an amount of adjustment for eliminating during grinding a remaining uncut portion due to a tool.

Still further, the method of creating the NC machining program according to the present invention is such that the shape data modification step includes a step of acquiring the amount of adjustment from tool data.

Yet further, the method of creating the NC machining program according to the present invention is such that when the shape data of the object to be machined is modified to create the shape data having the grinding allowance and in situations where an edge line for which a grinding allowance has been established and its adjacent edge line shape form an interior angle between 90 degrees and 180 degrees, the shape data modification step includes a step of additionally creating a pecking-for-grinding shape.

Still yet further, the method of creating the NC machining program according to the present invention is such that the shape data modification step includes a step of automatically recognizing a type of the pecking-for-grinding that is created, based on the pecking-for-grinding shape data and the grinding allowance data.

In addition, an apparatus for creating an NC machining program according to the present invention includes storing means that stores shape data of an object to be machined and grinding allowance data, shape data modification means that modifies the shape data to create shape data having a grinding allowance, based on the grinding allowance data, and NC machining program creation means that creates an NC machining program for the modified shape data, and when the shape data modification means creates shape data having a grinding allowance by modifying the shape data of the object to be machined and in situations where an uncut portion due to a tool cutting edge radius remains on an edge line segment adjacent to an edge line for which the grinding allowance is established, the shape data modification means includes means that creates shape data having a grinding allowance in which an amount of adjustment for eliminating during grinding the remaining uncut portion has been taken into consideration.

Further, the apparatus for creating the NC machining program is such that when the shape data of the object to be machined is modified to create shape data having a grinding allowance, the shape data modification means includes means that creates the shape data by taking into consideration an amount of adjustment for eliminating during grinding a remaining uncut portion due to a tool.

Still further, the apparatus for creating the NC machining program according to the present invention is such that the shape data modification means includes means that acquires the amount of adjustment from tool data.

Yet further, the apparatus for creating the NC machining program according to the present invention is such that when the shape data of the object to be machined is modified to create the shape data having the grinding allowance and in situations where an edge line for which a grinding allowance has been established and its adjacent edge line form an interior angle between 90 degrees and 180 degrees, the shape data modification means includes means that additionally creates a pecking-for-grinding shape.

Still yet further, the apparatus for creating the NC machining program according to the present invention is such that the shape data modification means includes means that automatically recognizes, based on the pecking-for-grinding shape data and the grinding allowance data, a type of the pecking-for-grinding that is created.

Advantageous Effects of the Invention

In accordance with the present invention, an NC machining program having a grinding allowance reflected in shape data can be created easily and efficiently.

Further, since shape data having a grinding allowance is created by taking into consideration an amount of adjustment for eliminating during grinding a remaining uncut portion due to a tool, an NC machining program can be provided that does not cause any uncut portion to remain even if the NC machining program having the grinding allowance reflected in the shape data is created.

Still further, since the amount of adjustment is acquired from tool data, an operator does not need to establish the amount of adjustment, and the NC machining program can be created more easily and efficiently.

Yet further, since pecking is performed for an inside corner of a grinding allowance portion, the inside corner can be finished by grinding as well.

Still yet further, since the type of pecking is recognized automatically, the operator does not need to establish the type of pecking, and the NC machining program can be created more easily and efficiently.

BRIEF DESCRIPTION OF DRAWINGS

FIG. 3 is a set of diagrams and a table, illustrating a method of modifying shape data according to Embodiment 1 of the present invention;

FIG. 6 shows a set of diagrams for supplementing description of the operations of FIG. 5;

FIG. 8 is a flow diagram illustrating operations in which the shape data modification unit creates a pecking-for-grinding shape, according to Embodiment 1 of the present invention;

FIG. 9 is a set of diagrams for supplementing description of the operations of FIG. 8;

FIG. 10 is a diagram illustrating another example of shapes of pecking for grinding, according to Embodiment 1 of the present invention;

FIG. 11 is a diagram illustrating types of pecking for grinding, data establishing ranges, meanings of pecking widths and pecking depths, and the like, according to Embodiment 1 of the present invention;

FIG. 12 is a diagram illustrating a comparison between an example of the grinding allowance shape without an amount of adjustment and an example of that with the amount of adjustment, according to Embodiment 1 of the present invention;

FIG. 14 is a set of diagrams for supplementing description of the operations of FIG. 13;

BEST MODE FOR CARRYING OUT THE INVENTION

Embodiment 1

Embodiment 1 according to the present invention will be described below with reference to FIGS. 1 through 14. It should be noted that this embodiment provides no limitations to the present invention.

Figures 1, 2:
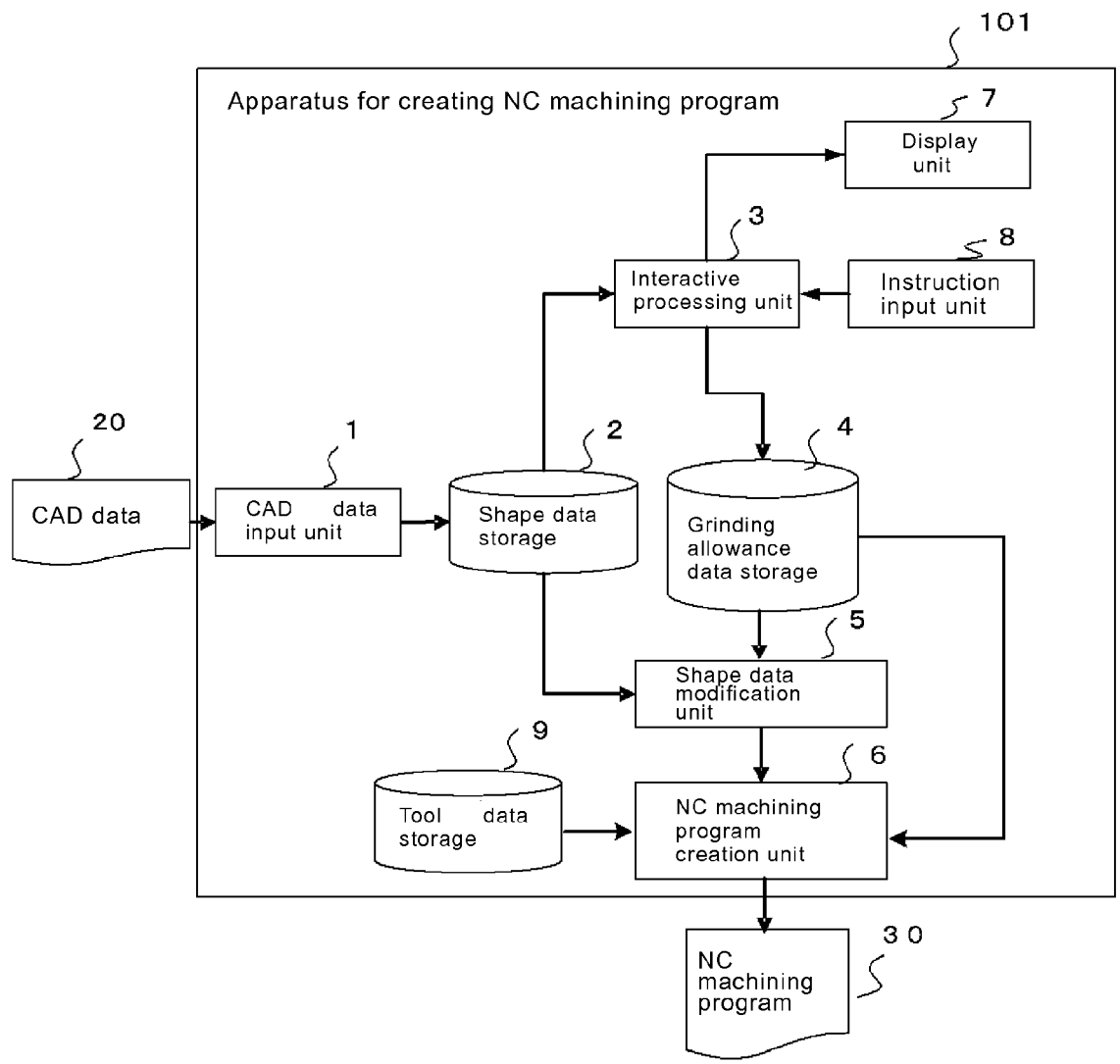
FIG. 1 is a block diagram illustrating an apparatus for creating an NC machining program according to Embodiment 1 of the present invention.
FIG. 2 is a table illustrating a grinding allowance data table according to Embodiment 1 of the present invention.

FIG. 1 is a block diagram illustrating an apparatus for creating an NC machining program according to Embodiment 1 of the present invention. An apparatus for creating an NC machining program, 101 includes a CAD data input unit 1, a shape data storage 2, an interactive processing unit 3, a grinding allowance data storage 4, a shape data modification unit 5, an NC machining program creation unit 6, a display unit 7, an instruction input unit 8, and a tool data storage 9.

It should be noted that the apparatus for creating the NC machining program 101, instead of being configured as a single unit, is in some cases configured within a personal computer or an NC apparatus. It should be also noted that the hardware configuration is substantially identical with that of a typical personal computer containing a CPU and a memory, and devices such as the interactive processing unit 3, the shape data modification unit 5 and the NC machining program creation unit 6 are implemented by software stored on non-transitory computer readable medium.

The CAD data input unit 1 receives CAD data 20 from a device such as an external device including a CAD system or a CAD data storage device, and then transmits it to the shape data storage 2. The CAD data 20 is configured to include data, such as shape data (basic dimensions of an object to be machined) of the object to be machined (workpiece)—created using a device such as a CAD system—and such as data associated with dimensional tolerances (or tolerance classes), which represent information of surface roughness established by the CAD system. The shape data storage 2 is memory means, such as a memory that stores the CAD data 20 from the CAD data input unit 1.

The display unit 7 is a display terminal, such as a liquid-crystal monitor, and displays data, such as the CAD data 20, graphical elements of shape data assigned by a user, and grinding allowance data and pecking shape data (type of pecking, pecking width and pecking depth), entered by the user.

The instruction input unit 8 is configured to include a mouse and a keyboard, through which instruction information from the user (such as data of a grinding allowance data table 51 that will be described later) is entered. The entered data such as the grinding allowance data is sent to the interactive processing unit 3.

The interactive processing unit 3 operates to display a screen needing to perform the interactive processing, and receives the instruction information from the instruction input unit 8, as well as causes the display unit 7 to display data, such as the CAD data 20 stored in the shape data storage 2, a data entry field for the grinding allowance data, and a data entry field for an amount of adjustment. Further, the interactive processing unit 3 receives from the instruction input unit 8, for instance, graphical elements of shape data assigned by an operator using a device such as the mouse, and grinding allowance data and amounts of adjustment that correspond to graphical elements of shape data entered by the operator using the keyboard. Furthermore, based on the instruction information from the instruction input unit 8, the interactive processing unit 3 associates the graphical elements of shape data in the CAD data 20 with the dimensional tolerance data, grinding allowance data, and amounts of adjustment, and also causes the grinding allowance data storage 4 to store the associated data (the grinding allowance data table 51 shown in FIG. 2).

Still further, the interactive processing unit 3 causes the display unit 7 to display fields, such as a data entry field for types of pecking (horizontal pecking, vertical pecking, and combined pecking), a data entry field for pecking width, and a data entry field for pecking depth, and associates the types of pecking, the pecking width and the pecking depth—entered through the instruction input unit 8, from the screen displayed on the display unit 7—with the graphical elements of shape data of the CAD data 20, and also causes the grinding allowance data storage 4 to store the associated data (the grinding allowance data table 51 shown in FIG. 2).

The grinding allowance data storage 4 is storage means, such as a memory, that stores the grinding allowance data table 51 from the interactive processing unit 3.

The shape data modification unit (shape data modification means) 5 reads data of the grinding allowance data table 51 stored in the grinding allowance data storage 4, calculates from shape data stored in the shape data storage 2 an amount of shift for each graphical element that is associated with the grinding allowance data, to modify the shape data (shifts a position of the graphical element) so that the grinding allowance is met. The shape data modification unit 5 further modifies the shape modified to meet the grinding allowance, into a shape containing a pecking-for-grinding shape, and also makes modifications so that an uncut portion due to a tool cutting edge radius does not remain after grinding. The shape data modification unit 5 inputs the modified shape data into the NC machining program creation unit 6.

The NC machining program creation unit (NC machining program creation means) 6 creates an NC machining program 30 to output the program externally, based on data, such as a shape and a position of each graphical element for the modified shape data, and tool data stored in the tool data storage 9.

The configuration of the grinding allowance data table 51 to be stored in the grinding allowance storage 4 will be described here. FIG. 2 is a table illustrating an example of a configuration of the grinding allowance data table 51. The grinding allowance data table 51 is an information table where "graphical element," "grinding allowance," "amount of adjustment," "type of pecking," "pecking width" and "pecking depth" are associated with each other. In the grinding allowance data table 51, each row represents data for a single grinding allowance.

A "graphical element" field, which represents a graphical element that is an object for which grinding allowance data is to be established, is associated with an ID ("No.") for the graphical element (such as a surface, edge line and vertex) of shape data stored in the shape data storage 2. A "grinding allowance" field represents a dimension of the grinding allowance, and an "amount of adjustment" represents a dimension for adjustment of a position for an edge line (the edge line located toward a place where there remains an uncut portion due to the tool cutting edge radius) of a grinding allowance so that the uncut portion does not remain. Further, pecking (pecking for grinding) is such that an inside corner is pre-machined to have a recessed portion therein so that the inside corner can be finished by grinding. A "type of pecking" field represents a type of pecking of any one of horizontal pecking, vertical pecking and combined pecking, and a "pecking width" field and a "pecking depth" field each represent a dimension that corresponds to the type of pecking.

The amount of adjustment and the pecking will be described later with reference to FIGS. 8 through 14.

The modification of shape data, which meets a grinding allowance, will be described next with reference to FIGS. 1 through 7.

A method of modifying the shape data so that the grinding allowance is met will be described first with reference mainly to FIG. 3.

When the operator first operates the instruction input unit 8, to place the machining program creation apparatus into a grinding allowance establishing mode, the interactive processing unit 3 causes the display unit 7 to display shape data 61 that has been stored in the shape data storage 2, a grinding allowance data entry field, an amount-of-adjustment data entry field, a data entry field for types of pecking (horizontal pecking, vertical pecking, and combined pecking), a pecking width data entry field, and a pecking depth data entry field. A guide to pecking, as shown in FIG. 11, which provides helpful information of entering the respective data of the type of pecking, a pecking width, and a pecking depth, can also be displayed during this displaying.

Next, the operator moves a cursor that is displayed on the display unit 7 using a device such as the mouse of the instruction input unit 8, to assign a place where the operator wishes to establish the grinding allowance data of the shape data 61 (an edge line 301A for this example). The edge line assigned at this time is displayed as highlighted. Next, using a device such as a ten-key of the instruction input unit 8, the grinding allowance data, the amount-of-adjustment data, the type of pecking, the pecking width data, and the pecking depth data are entered into the grinding allowance data entry field, the amount-of-adjustment data entry field, the type-of-pecking data entry field, the pecking width data entry field, and the pecking depth data entry field, respectively, and then a confirmation key of the instruction input unit 8 is operated. In this example, no data is entered other than the grinding allowance data.

When the operator performs the foregoing operation, the interactive processing unit 3 creates a grinding allowance data D11 that corresponds to the edge line 301A of the shape data 61, as shown, and stores it, as the grinding allowance data table 51, in the grinding allowance data storage 4.

It should be noted that the shape data 61 to be displayed on the display unit 7 represents a sectional shape on the XZ plane (positive), created from a shape where a turning surface for which turning is performed is derived from the CAD data 20 by rotating a workpiece material about a turning axis serving as the central axis.

Next, the shape data modification unit 5 consults the shape data 61 and the grinding allowance data table 51, to translate the edge line 301A so that the grinding allowance data D11 is met. At this time, an amount of shift, Δ is a grinding allowance of 0.3 millimeter. Also at this time, edge lines 302 and 303 adjacent to the edge line 301A are extended without being translated. The edge line 301A, after moving by a shift distance of the shift amount Δ, turns to an edge line 301B.

Next, when modification of the shape data by the shape data modification unit 5 is terminated, the NC machining program creation unit 6 creates the NC machining program 30, based on data such as tool data, and a shape and position of each graphical element for the modified shape data, and then outputs the program externally. Here, the NC machining program creation unit 6 creates the NC machining program 30 so that, when a surface roughness has been established for the graphical element (the edge line 301A) before establishing a grinding allowance, the surface roughness information of the edge line 301A is taken over to the shifted edge line 301B.

Figure 4:
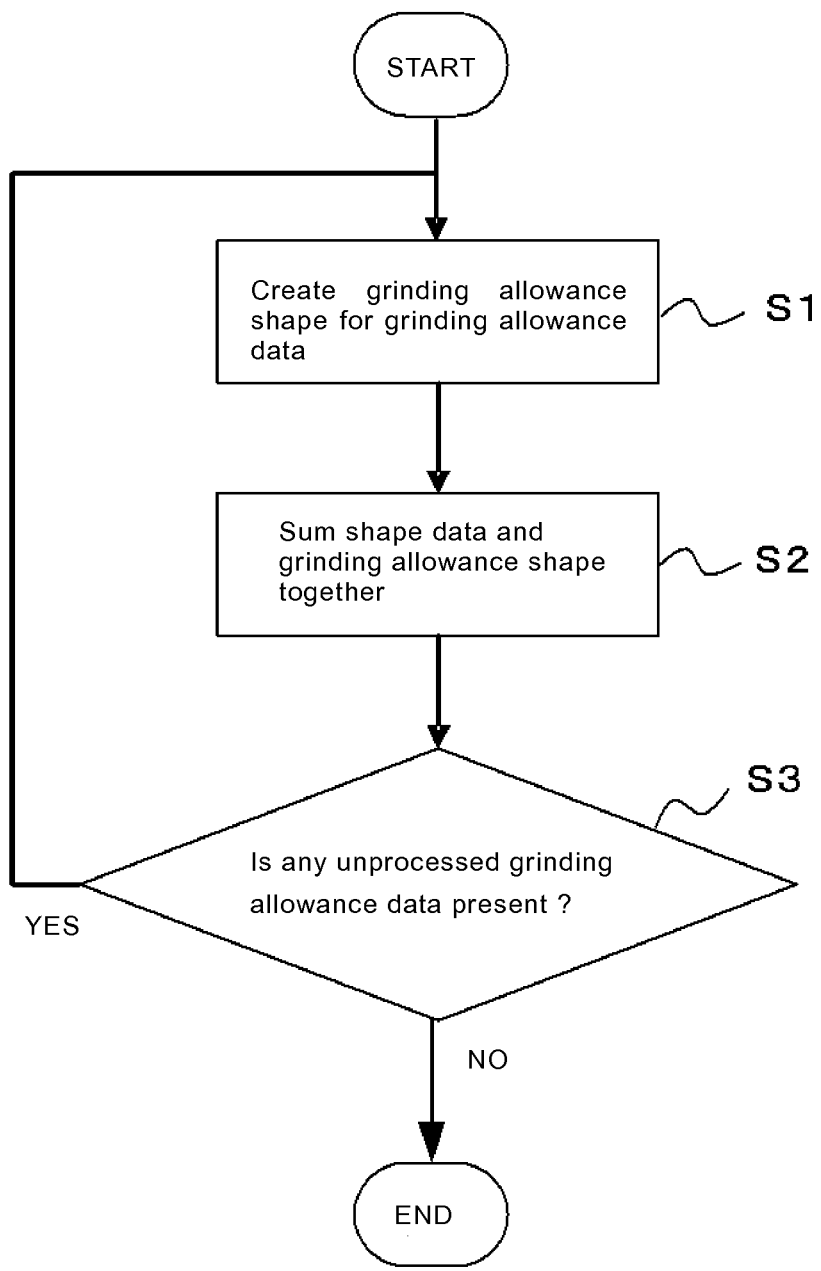
FIG. 4 is a flow diagram illustrating operations for a shape data modification in a shape data modification unit according to Embodiment 1 of the present invention.

FIG. 4 is a flow diagram illustrating operations of the shape data modification unit 5 in the apparatus for creating the NC machining program, according to Embodiment 1 of the present invention.

First, the shape data modification unit 5 employs the grinding allowance data within the grinding allowance data table 51, stored in the grinding allowance data storage 4 and the shape data 61 stored in the shape data storage 2, to create a grinding allowance shape (step S1).

Next, the shape data modification unit 5 sums together the created grinding allowance shape, and the shape data 61 stored in the shape data storage 2 (step S2). Here, the summation can be calculated through geometrical analysis.

The shape data modification unit 5 next determines at step S3 whether or not there is found any grinding allowance data unprocessed; if there is found an unprocessed grinding allowance data, then the modification is repeated for each shape data at step S1 and step S2. Further, if no unprocessed grinding allowance data is found to remain, then the shape data modification is terminated.

Detailed operations of the shape data modification unit 5 (details at step S1 in FIG. 4) will be described here with reference to FIGS. 5 and 6.

Figure 5:
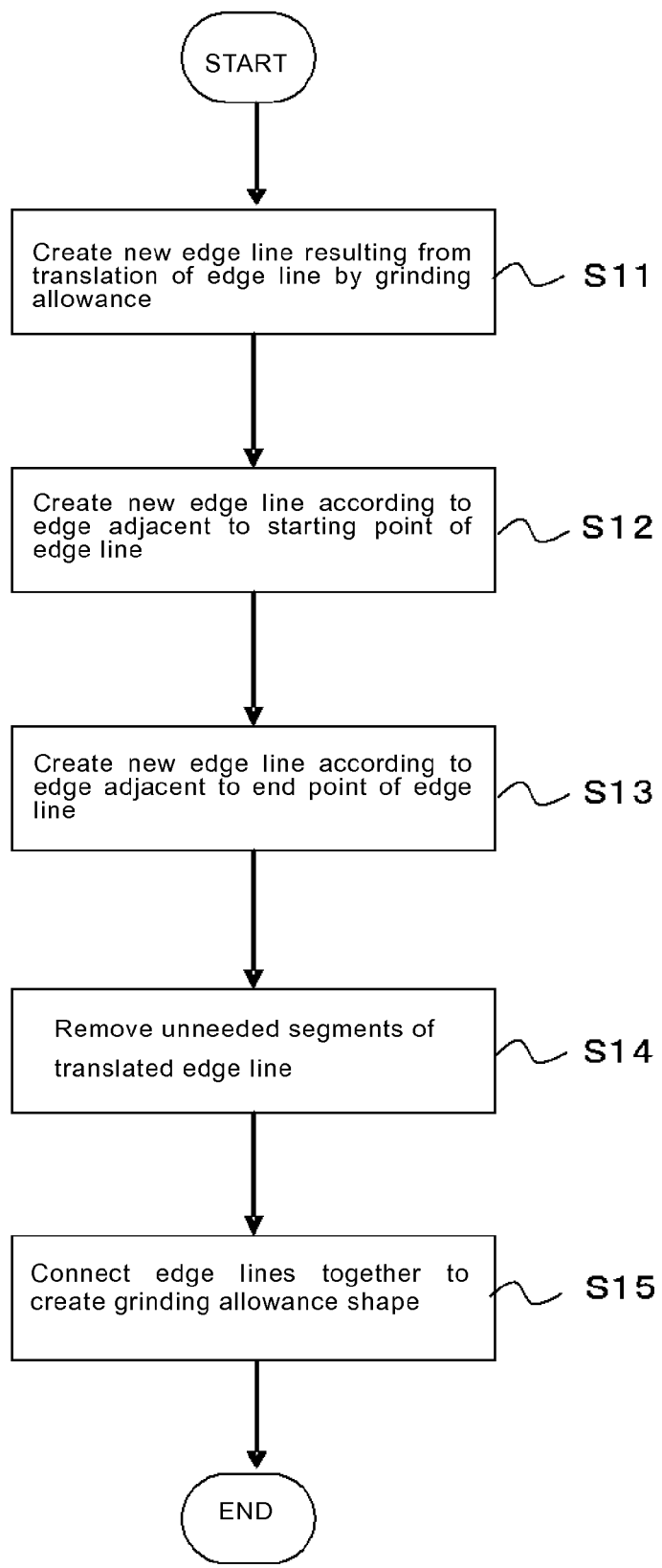
FIG. 5 is a flow diagram illustrating operations in which the shape data modification unit creates a grinding allowance shape, according to Embodiment 1 of the present invention.

First, in FIG. 5, an edge line 401B is created that results from translating an edge line 401A for which a grinding allowance has been established (step S11). FIG. 6(a) shows an example of the edge line 401A for which the grinding allowance has been established and the translated edge line 401B.

Next, an edge line 401C is created according to an edge line 402 that is adjacent to a starting point of the edge line 401A for which the grinding allowance has been established (step S12). FIG. 6(b) shows an example of the edge line 401C according to the edge line 402 that is adjacent to the starting point of the edge line 401A for which the grinding allowance has been established.

Subsequently, an edge line 401D is created according to an edge line 403 that is adjacent to an endpoint of the edge line 401A for which the grinding allowance has been established (step S13). FIG. 6(c) shows an example of the edge line 401D according to the edge line 403 that is adjacent to the endpoint of the edge line 401A for which the grinding allowance has been established.

Next, unneeded line segments are eliminated in the edge line 401B that results from translating the edge line 401A for which the grinding allowance has been established (step S14). FIG. 6(d) is a diagram showing an example of the edge line 401B having the unneeded line segments eliminated.

Subsequently, a grinding allowance shape 72 is created by connecting together the edge line 401A for which the grinding allowance has been established, the edge line 401B created by translation of the edge line 401A, the edge line 401C created at the starting point of the edge line for which a grinding allowance has been established, and the edge line 401D created at the endpoint of the edge line for which the grinding allowance has been established (step S15), into a closed loop. FIG. 6(e) shows an example of the created grinding allowance shape 72.

Figure 7:
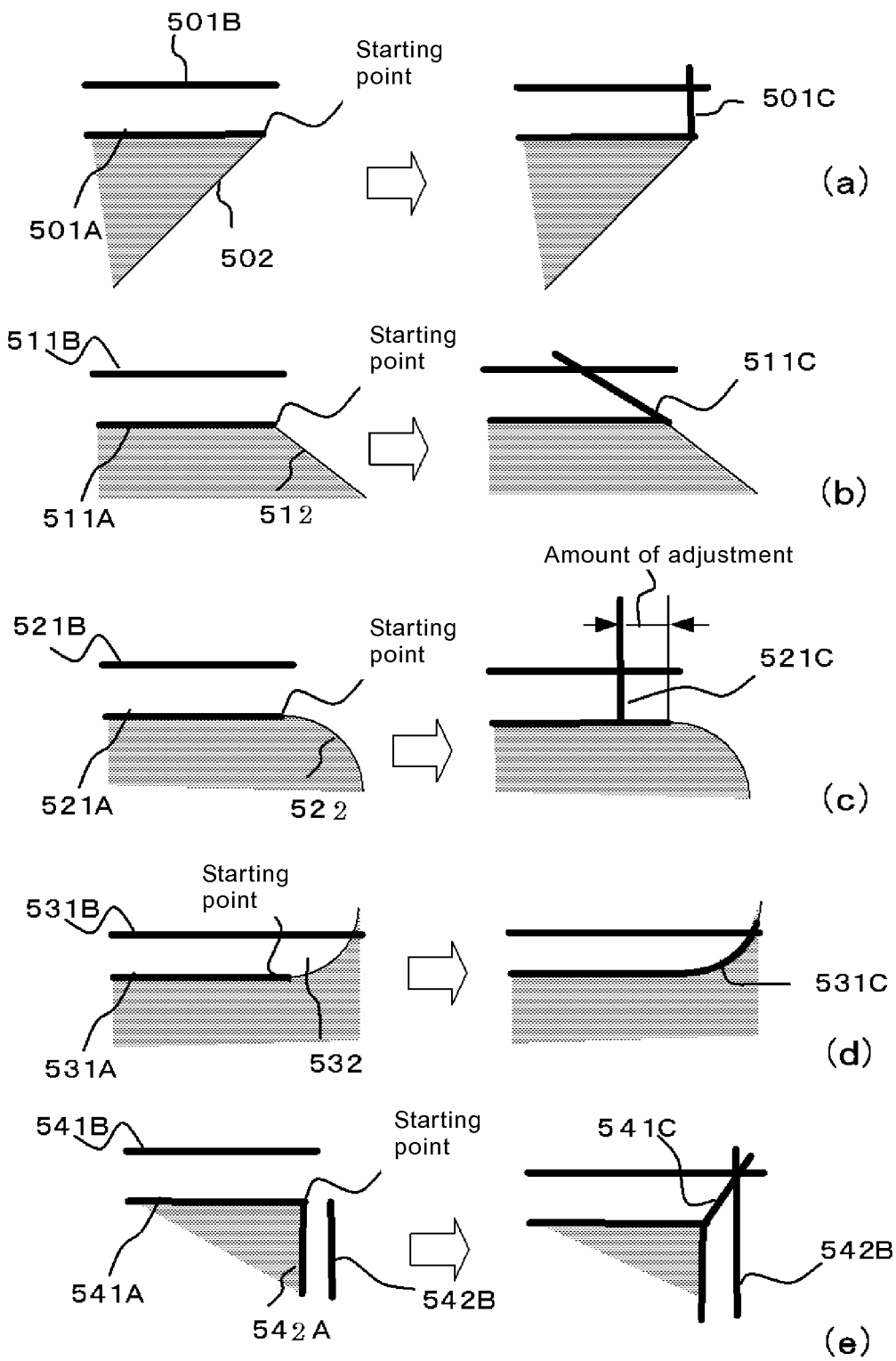
FIG. 7 is a set of diagrams illustrating operations in which the shape data modification unit creates grinding allowance shapes in various shapes, according to Embodiment 1 of the present invention.

Here, according to a connection state between a starting point of an edge line for which a grinding allowance has been established and its adjacent edge line (an angle formed between the edge line for which the grinding allowance has been established and the edge line adjacent to the starting point of the edge line), an edge line is created, as shown in FIG. 7, for an edge line that is adjacent to the starting point of the edge line for which the grinding allowance has been established.

More specifically, FIG. 7(a) shows an example where the connection state between the starting point of the edge line for which the grinding allowance has been established and the adjacent edge line is such that an angle formed between an edge line 501A for which a grinding allowance has been established and an edge line 502 adjacent to the edge line 501A is zero degree or more and 90 degrees or less. In this case, from the starting point of the edge line 501A for which the grinding allowance has been established, an edge line 501C is perpendicularly created with respect to the edge line 501A so as to cross with an edge line 501B created at a position where the edge line 501A for which the grinding allowance has been established is translated by the grinding allowance.

Further, FIG. 7(b) shows an example where an angle formed between an edge line 511A for which a grinding allowance has been established and an edge line 512 adjacent to the edge line 511A is more than 90 degrees and less than 180 degrees. In this case, from the starting point of the edge line 511A for which the grinding allowance has been established, an edge line 511C is extended from the starting point of the edge line 511A, tangentially with respect to the adjacent edge line 512 so as to cross with an edge line 511B created at a position where the edge line 511A for which the grinding allowance has been established is translated by the grinding allowance.

FIG. 7(c) shows an example where an angle formed between an edge line 521A for which a grinding allowance has been established and an edge line 522 adjacent to the edge line 521A is 180 degrees. In this case, from a position that has been translated by an amount of adjustment from the starting point of the edge line 521A for which the grinding allowance has been established, an edge line 521C is perpendicularly created with respect to the edge line 521A for which the grinding allowance has been established, so as to cross with an edge line 521B created at a position where the edge line 521A for which the grinding allowance has been established is translated by the grinding allowance. Here, this is an example where the edge line 521C is created from the position for which an amount of adjustment is taken into consideration.

Further, FIG. 7(d) shows an example where the angle formed between an edge line 531A for which a grinding allowance has been established and an edge line 532 adjacent to the edge line 531A is more than 180 degrees.

In this case, an edge line 531C is created along the adjacent edge line 532 from the starting point of the edge line 531A for which the grinding allowance has been established.

Still further, FIG. 7(e) shows an example where the angle formed between an edge line 541A for which a grinding allowance has been established and an edge line 542A adjacent to the edge line 541A is 90 degrees, and a grinding allowance has been established for the edge line 542A. In this case, an edge line 541C is extended from the starting point of the edge line 541A for which the grinding allowance has been established, toward an intersecting point between an edge line 541B created at a position where the edge line 541A for which the grinding allowance has been established is translated by the grinding allowance—and an edge line 542B created at a position where the edge line 542A is translated by a grinding allowance established for the adjacent edge line 542A.

It should be noted that, as with the creation of the edge line adjacent to the starting point of an edge line for which the grinding allowance has been established, an edge line is also created which is adjacent to the endpoint of the foregoing edge line for which the grinding allowance has been established.

The operation of the shape data modification unit 5 creating a pecking-for-grinding shape will be described next with reference to FIGS. 8 through 11. Here, pecking for grinding refers to a pre-machined recessed portion for allowing an inside corner to be finished by grinding.

Referring to FIG. 8, the shape data modification unit 5 first consults the grinding allowance data table 51 (refer to FIG. 2) stored in the grinding allowance data storage 4 and in which graphical elements, grinding allowances, amounts of adjustment, types of pecking, pecking widths and pecking depths have been established, and the shape data 61 stored in the shape data storage 2, and then checks whether the edge line for which the grinding allowance has been established and its adjacent edge line are connected together at an interior angle between 90 degrees and 180 degrees (step S21). If the edge line for which the grinding allowance has been established and its adjacent edge line are not connected together at an interior angle between 90 degrees and 180 degrees, then processing ends.

When the edge line for which the grinding allowance has been established and its adjacent edge line are connected together at an interior angle between 90 degrees and 180 degrees, to form a pecking shape, a pecking-for-grinding shape 81 is created at that place, as shown in FIG. 9(a), using its corresponding data for type of pecking, pecking width and pecking depth, stored in the grinding allowance data table 51 (step S22).

Next, the created pecking-for-grinding shape 81 is subtracted from the grinding allowance shape, to create a grinding allowance shape 82 having pecking for grinding, as shown in FIG. 9(b) (step S23). Referring to FIGS. 9(a) and 9(b), an edge line for which a grinding allowance has been established is designated by 601A; an edge line resulting from translation of the edge line 601A for which the grinding allowance has been established, by 601B; and an edge line adjacent to the edge line 601A for which the grinding allowance has been established, by 602.

Here, pecking for grinding refers to a pre-machined recess for allowing an inside corner to be finished by grinding. For that reason, the pecking-for-grinding shape needs to be created according to purposes; FIG. 10 shows examples of the pecking-for-grinding shape other than the pecking-for-grinding shape 81 shown in FIG. 9.

Further, FIG. 11 is a diagram showing information such as types of pecking, data establishing range, and meanings for pecking-for-grinding width and pecking-for-grinding depth, which are helpful in entering the pecking data from the grinding allowance data table 51. The horizontal pecking represents a pecking shape such that the length of its base is the pecking-for-grinding width, the length of its upper side is the pecking-for-grinding width plus the pecking-for-grinding depth, and the distance between its upper side and its base is the grinding depth. The vertical pecking represents a pecking shape like a shape that results from 90 degree rotation of the shape in which the length of its base is the pecking-for-grinding width, the length of its upper side is the pecking-for-grinding width plus the pecking-for-grinding depth, and the distance between its upper side and its base is the pecking-for-grinding depth. Still further, the combined pecking represents a pecking shape such that the horizontal pecking and the vertical pecking are combined together.

In addition, it has been described that when the shape data modification unit 5 creates a pecking-for-grinding shape, the grinding allowance shape 82 having the pecking for grinding is created using the type of pecking, the pecking width and the pecking depth, established in the grinding allowance data table 51; however, the type of pecking does not need to be established for the grinding allowance data table 51 when the shape data modification unit 5 has automatic recognition capability of the type of pecking for grinding—the capability with which when a grinding allowance is also established for an adjacent edge line, the type of pecking is determined to be the combined pecking; when the grinding allowance is not established for the adjacent edge line and the edge line for which the grinding allowance has been established is parallel with a turning axis, the type of pecking is determined to be the horizontal pecking; and when the grinding allowance is not established for the adjacent edge line and the edge line for which the grinding allowance has been established is perpendicular to a turning axis, the type of pecking is determined to be the vertical pecking.

If the pecking depth is assumed to equal to the grinding allowance, the pecking depth does not need to be established for the grinding allowance data table 51. In this case, however, grinding allowance data that has been established in the grinding allowance data table 51 needs to be consulted as the pecking depth.

The amount of adjustment for adjusting the position of an edge line for grinding allowance (the edge line located toward a place where there remains an uncut portion due to the tool cutting edge radius) so that the uncut portion is prevented from remaining, will be described next with reference to FIGS. 12 through 14.

When the angle formed between an edge line for which a grinding allowance is established and its adjacent edge line is, for example, 180 degrees, the tool cutting edge radius causes an uncut portion to remain, as shown in the left part of FIG. 12. Unless the position of the edge line for grinding allowance (the edge line located toward a place where there remains an uncut portion due to the tool cutting edge radius) is adjusted, then the remaining uncut portion is not eliminated during removal of the grinding allowance, and remains as it is.

Figure 13:
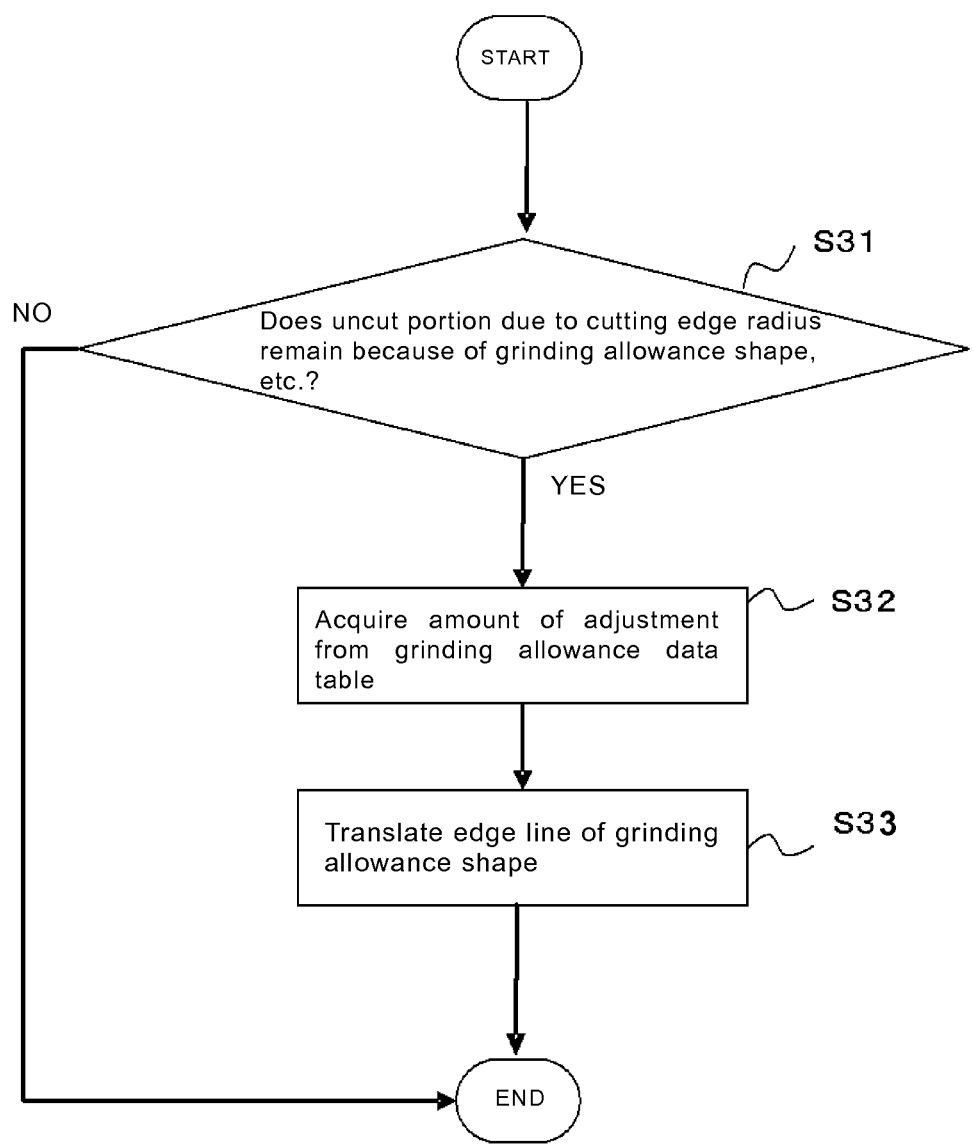
FIG. 13 is a flow diagram illustrating operations in which the shape data modification unit provides the amount of adjustment to the grinding allowance shape, according to Embodiment 1 of the present invention.

For this reason, the shape data modification unit 5 consults the shape data 61 and the grinding allowance data table 51 at a time of establishing the foregoing grinding allowance, to determine whether or not the angle formed between an edge line for which a grinding allowance is established and its adjacent edge line is 180 degrees, as shown in FIG. 13, whereby the modification unit 5 determines whether it is an edge line where the tool cutting edge radius causes an uncut portion to remain (step S31). It should be noted that situations where the angle formed between an edge line for which a grinding allowance is established and its adjacent edge line is 180 degrees also include a situation where a straight line and another straight line are tangentially continuously connected smoothly together, other than that shown in FIG. 12 where a straight line and an arc are connected smoothly together.

If it is determined not to be the edge line where the tool cutting edge radius causes an uncut portion to remain, then processing ends. And if it is determined to be the edge line where the tool cutting edge radius causes an uncut portion to remain, then an amount of adjustment is acquired from the grinding allowance data table 51 shown in FIG. 2 (step S32). Based on the acquired amount of adjustment, the position of the grinding allowance edge line (the edge line located toward a place where the tool cutting edge radius causes an uncut portion to remain) is adjusted (the width of a grinding allowance shape is reduced by as much amount as the tool cutting edge radius causes an uncut portion to remain), as shown in FIG. 14. Here, FIG. 14(a) shows a grinding allowance shape before the adjustment, and FIG. 14(b) shows a grinding allowance shape after the adjustment. In FIG. 14, the edge line for which a grinding allowance is established is designated by 601A; the edge line that results from translation of the edge line 601A by the grinding allowance, by 601B; the edge line before the adjustment, by 602A; and an edge line after the adjustment, by 602B.

As a result, even if there remains the uncut portion due to the tool cutting edge radius by establishing a grinding allowance for an edge line having an angle of 180 degrees with its adjacent edge line, as shown in the right part of FIG. 12, the foregoing amount of adjustment causes the remaining uncut portion to be eliminated during removal of the grinding allowance; thus, end products can be provided which have no remaining uncut portion due to the tool cutting edge radius.

Embodiment 2

In Embodiment 1, in situations where the edge line 601A for which the grinding allowance has been established and its adjacent edge line 602 are connected together at an interior angle of 90 degrees, to form the pecking shape, the shape data modification unit 5 creates a pecking-for-grinding shape; however, without the shape data modification unit 5 creating the pecking-for-grinding shape, and with attributes of pecking for grinding being imparted to the edge line 601B that is to be created by translating by a grinding allowance the edge line 601A for which the grinding allowance has been established, the NC machining program creation unit 6 can also create an NC machining program for machining the pecking for grinding, based on information of the pecking-for-grinding attributes imparted to the edge line 601B. Instances of this NC machining program includes an NC machining program, inclusive of machining of pecking for grinding, that is created according to the shape of a tool to be used, and an NC machining program that is created for machining only the pecking for grinding.

Figure 15:
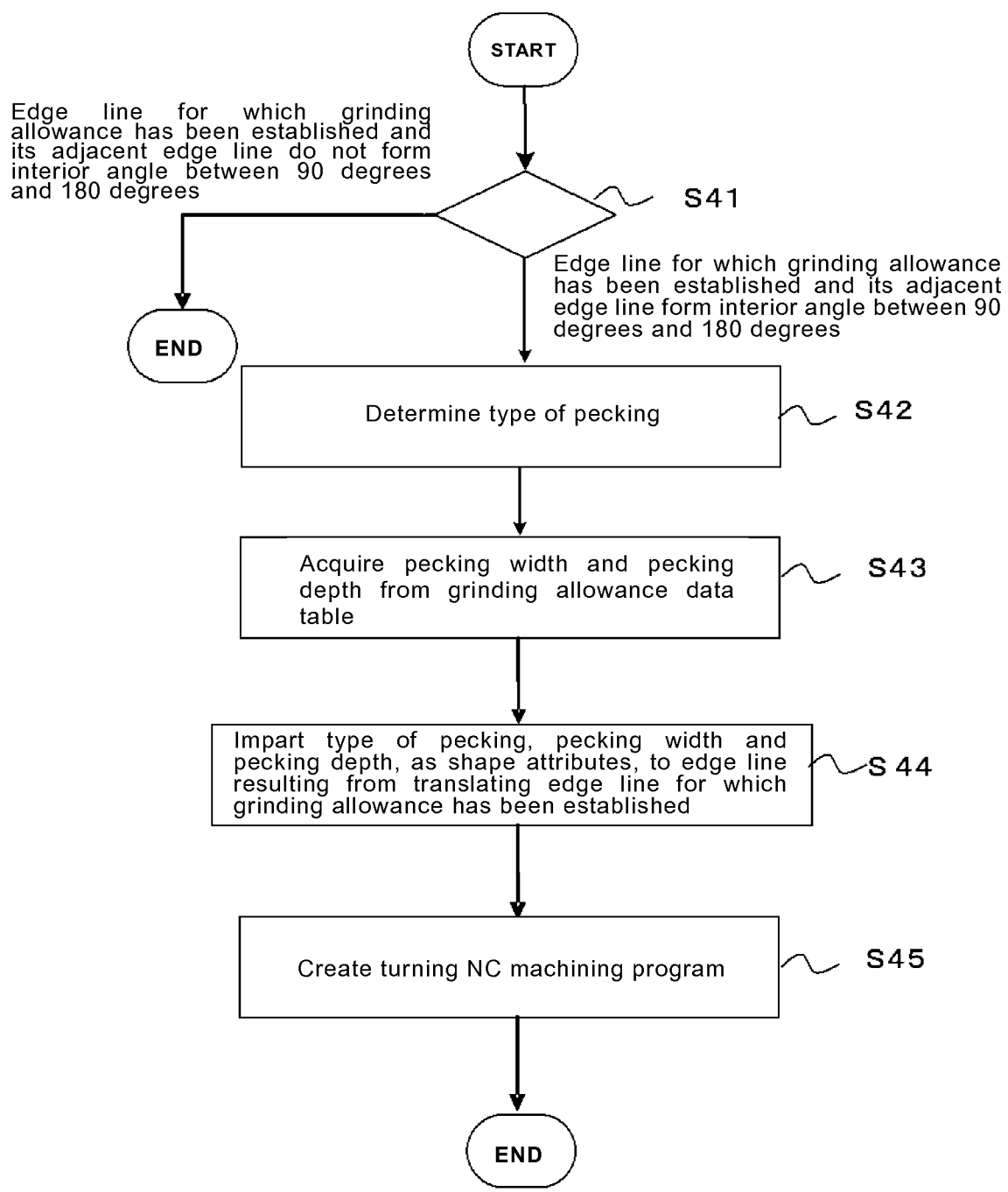
FIG. 15 is a flow diagram illustrating operations of an NC machining program creation unit according to Embodiment 2 of the present invention.

FIG. 15 is a flow diagram showing operations where the NC machining program creation unit 6 creates the NC machining program for machining of the pecking for grinding, based on the information of the pecking-for-grinding attributes imparted to an edge line.

Figures 16, 17:
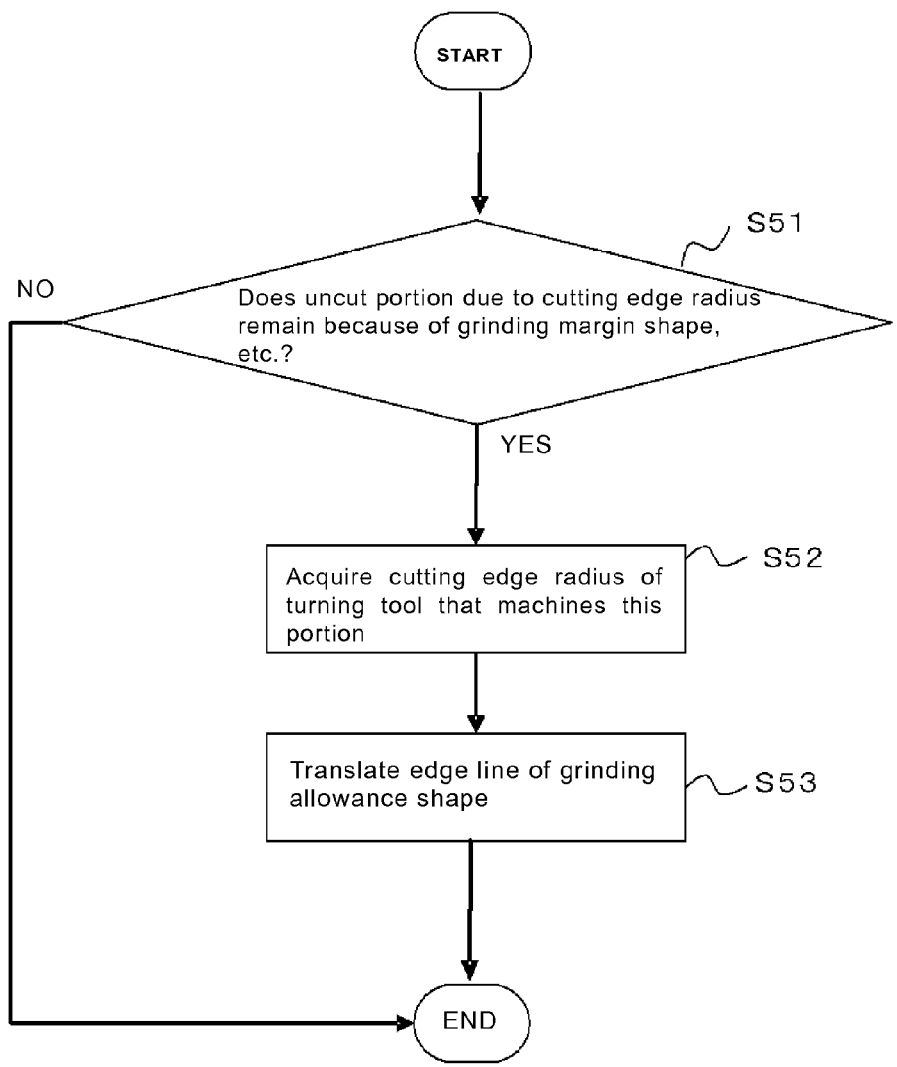
FIG. 16 is a table illustrating a grinding allowance data table according to Embodiment 2 of the present invention.
FIG. 17 is a flow diagram illustrating operations of an NC machining program creation unit according to Embodiment 3 of the present invention.

In this case, the type of pecking does not need to be established for the grinding allowance data table 51, as shown in FIG. 16, and nor does the pecking depth need to be established for the grinding allowance data table 51 if the pecking depth is assumed to equal to the grinding allowance.

Referring to FIG. 15, the program creation unit, first, checks whether an edge line for which a grinding allowance has been established and its adjacent edge line are connected together at an interior angle between 90 degrees and 180 degrees (step S41). Unless the edge line for which the grinding allowance has been established and its adjacent edge line are connected at an interior angle between 90 degrees and 180 degrees, then processing ends.

If the edge line for which the grinding allowance has been established and its adjacent edge line are connected together at an interior angle between 90 degrees and 180 degrees, then the program creation unit determines the type of pecking from the edge line for which the grinding allowance has been established and its adjacent edge line (step S42). If a grinding allowance is established for an adjacent edge line as well, then the type of pecking is determined to be the combined pecking. If the grinding allowance is not established for the adjacent edge line and the edge line for which the grinding allowance has been established is parallel with a turning axis, then the type of pecking is determined to be the horizontal pecking. If the grinding allowance is not established for the adjacent edge line and the edge line for which the grinding allowance has been established is perpendicular to the turning axis, then the type of pecking is determined to be the vertical pecking.

The pecking width data and pecking depth data, stored in the grinding allowance data table 51, are acquired next (step S43). Here, if the pecking depth is assumed to equal to the grinding allowance, then the grinding allowance data is acquired as the pecking depth because no data has been entered in the pecking depth field of the grinding allowance data table 51.

Next, the type of pecking, determined at step S42 and the pecking width and pecking depth, acquired at step S43, are imparted to an edge line resulting from translation of an edge line for which a grinding allowance has been established as a shape attribute (step S44).

As a result, shapes shown in FIG. 9(b) and FIG. 10 are recognized (created) within the NC machining program creation unit 6.

And an NC machining program for turning is finally created, based on information such as the shape (step S45).

In this way, the NC machining program creation unit 6 can create the NC machining program for machining the pecking for grinding, based on the information of the pecking-for-grinding attributes imparted to the edge line.

Embodiment 3

In Embodiment 1, description is provided in which the operator establishes an amount of adjustment, and the shape data modification unit 5 translates, based on the amount of adjustment, an edge line of a grinding allowance shape, thereby preventing an uncut portion due to the tool cutting edge radius from remaining; however, in situations where the operator has not established the amount of adjustment (or does not need to establish an amount of adjustment), the NC machining program creation unit 6 may calculates the amount of adjustment, to translate an edge line of a grinding allowance shape.

FIG. 17 is a flow diagram showing operations of the NC machining program creation unit 6 according to the present embodiment. The NC machining program creation unit 6 determines, based on shape data (including a grinding allowance shape) from the shape data modification unit 5, whether or not the angle formed between an edge line and its adjacent edge line is 180 degrees and thereby, the program creation unit determines whether it is an edge line where the tool cutting edge radius causes an uncut portion to remain (step S51). If it does not remain, then processing ends.

When the tool cutting edge radius causes an uncut portion to remain, data for the cutting edge radius of a tool that machines a machining shape inclusive of an edge line where the uncut portion remains is acquired from the tool data storage 9 (step S52).

Next, the edge line of the grinding allowance shape where the uncut portion remains is translated by the acquired data amount of the tool cutting edge radius (or by the data for the tool cutting edge radius plus a little something extra) and is re-connected with its adjacent edge line, as shown in FIG. 14(b) (step S53).

Here, this capability for automatic acquisition of the amount of adjustment can be imparted to the shape data modification unit 5.

As described above, in accordance with these embodiments, an appropriate NC machining program that has a grinding allowance reflected in shape data can be created easily and efficiently. Moreover, since grinding allowance data only has to be established for only a place that is associated with the modification of a shape, desirable NC machining programs can be easily created with little time and effort.

Further, since shape data having a grinding allowance is created by taking into consideration an amount of adjustment for eliminating a remaining uncut portion during grinding, an NC machining program can be provided that does not cause any uncut portion to remain even if the NC machining program having the grinding allowance reflected in the shape data is created.

Still further, since the amount of adjustment is acquired from tool data, an operator does not need to establish the amount of adjustment, and the NC machining programs can be created more easily and efficiently.

Yet further, since pecking is performed for an inside corner of a grinding allowance portion, the inside corner can be finished by grinding as well.

Still yet further, since the type of pecking is recognized automatically, the operator does not need to establish the type of pecking, and the NC machining programs can be created more easily and efficiently.

INDUSTRIAL APPLICABILITY

As described above, a method and an apparatus for creating an NC machining program and a program for causing a computer to implement the creation method, in accordance with this invention, are applicable to creation of an NC machining program into which to incorporate a grinding allowance.

REFERENCE NUMERALS

1 CAD data input unit
2 Shape data storage

3 Interactive processing unit
4 Grinding allowance data storage
5 Shape data modification unit
6 NC machining program creation unit
7 Display unit
8 Instruction input unit
9 Tool data storage
10 NC machining program
11 Grinding allowance data table

The invention claimed is:

1. A method of creating, based on shape data of an object to be machined and on grinding allowance data for the shape data, a numerically controlled machining program that has the grinding allowance data reflected in the shape data, the method comprising:
 a step of storing the shape data of the object to be machined and the grinding allowance data;
 a shape data modification step of modifying, based on the grinding allowance data, the shape data, to create shape data having a grinding allowance; and
 a step of creating a numerically controlled machining program for the modified shape data,
wherein the shape data modification step includes a step of determining, when the shape data of the object to be machined is modified to create shape data having a grinding allowance, whether or not an uncut portion due to a tool cutting edge radius remains on an edge line segment adjacent to an edge line for which a grinding allowance is established; and of creating, in situations where the uncut portion due to the tool cutting edge radius remains on the edge line segment adjacent to the edge line for which the grinding allowance is established, shape data having a grinding allowance in which an amount of adjustment for eliminating during the remaining uncut portion has been taken into consideration.

2. The method of creating the numerically controlled machining program of claim 1, wherein the shape data modification step includes a step of acquiring the amount of adjustment from tool data.

3. The method of creating the numerically controlled machining program of claim 2, wherein when the shape data of the object to be machined is modified to create the shape data having the grinding allowance and in situations where an edge line for which a grinding allowance has been established and its adjacent edge line form an interior angle between 90 degrees and 180 degrees, the shape data modification step includes a step of additionally creating a pecking-for-grinding shape.

4. A non-transitory computer readable medium storing a program for causing a computer to implement the method of creating the numerically controlled machining program of claim 3.

5. The method of creating the numerically controlled machining program of claim 2, wherein the shape data modification step includes a step of automatically recognizing a type of the pecking-for-grinding that is created, based on the pecking-for-grinding shape data and the grinding allowance data.

6. The method of creating the numerically controlled machining program of claim 2, wherein the shape data modification step further includes a step of assigning an edge line for which a grinding allowance is established in the shape data of the object to be machined; a step of translating the assigned edge line by the grinding allowance data; and a step of extending an edge line adjacent to the assigned edge line, to a point where the edge line crosses with the assigned edge line, in a direction determined based on an angle formed by connection between the edge line and the assigned edge line.

7. A non-transitory computer readable medium storing a program for causing a computer to implement the method of creating the numerically controlled machining program of claim 2.

8. The method of creating the numerically controlled machining program of claim 1, wherein when the shape data of the object to be machined is modified to create the shape data having the grinding allowance and in situations where an edge line for which a grinding allowance has been established and its adjacent edge line form an interior angle between 90 degrees and 180 degrees, the shape data modification step includes a step of additionally creating a pecking-for-grinding shape.

9. A non-transitory computer readable medium storing a program for causing a computer to implement the method of creating the numerically controlled machining program of claim 8.

10. The method of creating the numerically controlled machining program of claim 1, wherein the shape data modification step includes a step of automatically recognizing a type of the pecking-for-grinding that is created, based on the pecking-for-grinding shape data and the grinding allowance data.

11. The method of creating the numerically controlled machining program of claim 1, wherein the shape data modification step further includes a step of assigning an edge line for which a grinding allowance is established in the shape data of the object to be machined; step of translating the assigned edge line by the grinding allowance data; and a step of extending an edge line adjacent to the assigned edge line, to a point where the edge line crosses with the assigned edge line, in a direction determined based on an angle formed by connection between the edge line and the assigned edge line.

12. A non-transitory computer readable medium storing a program for causing a computer to implement the method of creating the numerically controlled machining program of claim 1.

13. An apparatus for creating, based on shape data of an object to be machined and grinding allowance data for the shape data, a numerically controlled machining program that has the grinding allowance data reflected in the shape data, the program creation apparatus comprising:
 a storing unit that stores the shape data of the object to be machined and the grinding allowance data;
 a shape data modification unit that modifies, based on the grinding allowance data, the shape data, to create shape data having a grinding allowance,
 a numerically controlled machining program creation unit that creates a numerically controlled machining program for the modified shape data, and
 a unit that creates, in situations where an uncut portion due to a tool cutting edge radius remains on an edge line segment adjacent to an edge line for which a grinding allowance is established, shape data having a grinding allowance in which an amount of adjustment for eliminating during grinding the remaining uncut portion has been taken into consideration.

14. The apparatus for creating the numerically controlled machining program of claim 13, wherein the shape data modification unit includes a unit that acquires the amount of adjustment from tool data.

15. The apparatus for creating the numerically controlled machining program of claim 14, wherein when the shape data of the object to be machined is modified to create the shape data having the grinding allowance and in situations where an edge line for which a grinding allowance has been established and its adjacent edge line form an interior angle between 90 degrees and 180 degrees, the shape data modification unit includes a unit that additionally creates a pecking-for-grinding shape.

16. The apparatus for creating the numerically controlled machining program of claim 14, wherein the shape data modification unit includes a unit that automatically recognizes, based on the pecking-for-grinding shape data and the grinding allowance data, a type of the pecking-for-grinding that is created.

17. The apparatus for creating the numerically controlled machining program of 14, wherein the shape data modification unit further includes a unit that assigns an edge line for which a grinding allowance is established in the shape data of the object to be machined; a unit that translates the assigned edge line by the grinding allowance data; and a unit that extends an edge line adjacent to the assigned edge line, to a point where the edge line crosses with the assigned edge line, in a direction determined based on an angle formed by connection between the edge line and the assigned edge line.

18. The apparatus for creating the numerically controlled machining program of claim 13, wherein when the shape data of the object to be machined is modified to create the shape data having the grinding allowance and in situations where an edge line for which a grinding allowance has been established and its adjacent edge line form an interior angle between 90 degrees and 180 degrees, the shape data modification unit includes a unit that additionally creates a pecking-for-grinding shape.

19. The apparatus for creating the numerically controlled machining program of claim 13, wherein the shape data modification unit includes a unit that automatically recognizes, based on the pecking-for-grinding shape data and the grinding allowance data, a type of the pecking-for-grinding that is created.

20. The apparatus for creating the numerically controlled machining program of 13, wherein the shape data modification unit further includes a unit that assigns an edge line for which a grinding allowance is established in the shape data of the object to be machined; a unit that translates the assigned edge line by the grinding allowance data; and a unit that extends an edge line adjacent to the assigned edge line, to a point where the edge line crosses with the assigned edge line, in a direction determined based on an angle formed by connection between the edge line and the assigned edge line.

* * * * *